(12) United States Patent
Iguchi

(10) Patent No.: US 11,646,547 B2
(45) Date of Patent: May 9, 2023

(54) LIGHT EMITTING DEVICE

(71) Applicant: FUJIFILM Business Innovation Corp., Tokyo (JP)

(72) Inventor: Daisuke Iguchi, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 595 days.

(21) Appl. No.: 16/716,448

(22) Filed: Dec. 16, 2019

(65) Prior Publication Data

US 2020/0366062 A1    Nov. 19, 2020

(30) Foreign Application Priority Data

May 17, 2019  (JP) .............................. JP2019-093826

(51) Int. Cl.
| | |
|---|---|
| *H01S 5/042* | (2006.01) |
| *H01S 5/183* | (2006.01) |
| *H01S 5/02345* | (2021.01) |

(52) U.S. Cl.
CPC .......... *H01S 5/183* (2013.01); *H01S 5/02345* (2021.01); *H01S 5/04256* (2019.08)

(58) Field of Classification Search
CPC .. H01S 5/183; H01S 5/02345; H01S 5/04256; H01S 5/02325; H01L 2224/16227; H01L 2224/48227
See application file for complete search history.

(56) References Cited

U.S. PATENT DOCUMENTS

| | | |
|---|---|---|
| 7,336,501 B2 | 2/2008 | Tanaka |
| 7,436,681 B2 | 10/2008 | Tanaka |
| 7,457,333 B2 | 11/2008 | Moto |
| 9,226,399 B2 | 12/2015 | Tanaka |
| 10,637,206 B2 | 4/2020 | Halbritter et al. |
| 10,789,879 B1 * | 9/2020 | Iguchi ...................... G09G 3/32 |
| 11,070,025 B2 | 7/2021 | Wojcik et al. |
| 11,177,628 B2 | 11/2021 | Halbritter et al. |
| 11,552,449 B2 | 1/2023 | Fröhlich et al. |
| 2004/0003288 A1 | 1/2004 | Wiseman |
| 2007/0045815 A1 * | 3/2007 | Urashima ........... H01L 23/5383 |
| | | 257/E23.079 |
| 2008/0127470 A1 | 6/2008 | Tanaka |
| 2008/0239685 A1 * | 10/2008 | Kawabe ................... H01G 4/33 |
| | | 361/782 |
| 2009/0003398 A1 | 1/2009 | Moto |

FOREIGN PATENT DOCUMENTS

| | | |
|---|---|---|
| JP | 2004281682 | 10/2004 |
| JP | 2008010867 | 1/2008 |
| JP | 2012178519 | 9/2012 |
| JP | 2019511128 | 4/2019 |
| WO | 2018188910 | 10/2018 |

OTHER PUBLICATIONS

"Office Action of Japan Counterpart Application", dated Jan. 17, 2023, with English translation thereof, pp. 1-6.

* cited by examiner

*Primary Examiner* — Yuanda Zhang
(74) *Attorney, Agent, or Firm* — JCIPRNET

(57) ABSTRACT

A light emitting device includes a substrate, a light emitting element, a driving element, and a capacitor layer. The light emitting element and the driving element are provided on the substrate. The driving element drives the light emitting element. The capacitor layer is provided in the substrate and supplies electric current to the light emitting element via the driving element.

11 Claims, 3 Drawing Sheets

LIGHT EMITTING DEVICE

CROSS-REFERENCE TO RELATED APPLICATIONS

This application is based on and claims priority under 35 USC 119 from Japanese Patent Application No. 2019-093826 filed May 17, 2019.

BACKGROUND

(i) Technical Field

The present disclosure relates to light emitting devices.

(ii) Related Art

Japanese Unexamined Patent Application Publication No. 2012-178519 discloses a capacitor-incorporated photoelectric consolidation package. The capacitor-incorporated photoelectric consolidation package includes a core substrate having a principal surface and a rear surface and having an accommodation hole at least in the principal surface, a capacitor having a plate shape with a first principal surface and a second principal surface and accommodated in the accommodation hole, a resin filler material filled in a gap between an inner wall surface of the accommodation hole and the capacitor, and a wiring multilayer formed by alternately stacking an interlayer dielectric layer and a conductive layer on the principal surface of the core substrate and the first principal surface of the capacitor. The wiring multilayer has set thereon a large-scale-integration (LSI) installation region in which an LSI for processing an electric signal is to be installed, an optical-element installation region in which an optical element for performing signal conversion between an electric signal and an optical signal is to be installed, and an optical-element-control integrated-circuit (IC) installation region in which an optical-element-control IC for controlling the optical element is to be installed. Moreover, the wiring multilayer has a signal-transmission wiring path for electrically connecting the LSI and the optical-element-control IC, a first-power-source-stabilization wiring path for electrically connecting the LSI and the capacitor, and a second-power-source-stabilization wiring path for electrically connecting the optical-element-control IC and the capacitor.

SUMMARY

Aspects of non-limiting embodiments of the present disclosure relate to a light emitting device in which the impedance of a driving circuit may be reduced, as compared with a configuration that supplies driving current to a light emitting element only from a chip-type capacitive element provided on a substrate.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light emitting device including a substrate, a light emitting element, a driving element, and a capacitor layer. The light emitting element and the driving element are provided on the substrate. The driving element drives the light emitting element. The capacitor layer is provided in the substrate and supplies electric current to the light emitting element via the driving element.

BRIEF DESCRIPTION OF THE DRAWINGS

Exemplary embodiments of the present disclosure will be described in detail based on the following figures, wherein.

DETAILED DESCRIPTION

Exemplary embodiments of the present disclosure will be described in detail below with reference to the drawings.

First Exemplary Embodiment

Figure 1A:
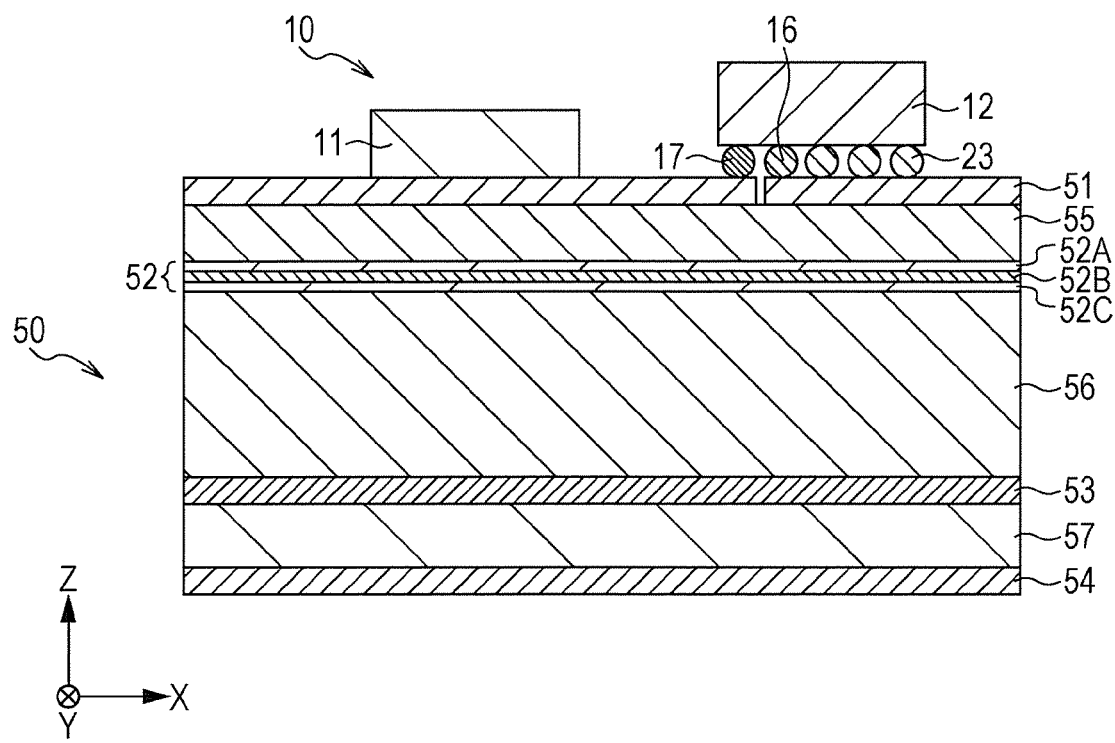
FIG. 1A is a cross-sectional view illustrating an example of the configuration of a light emitting device according to an exemplary embodiment.
Figure 1B:
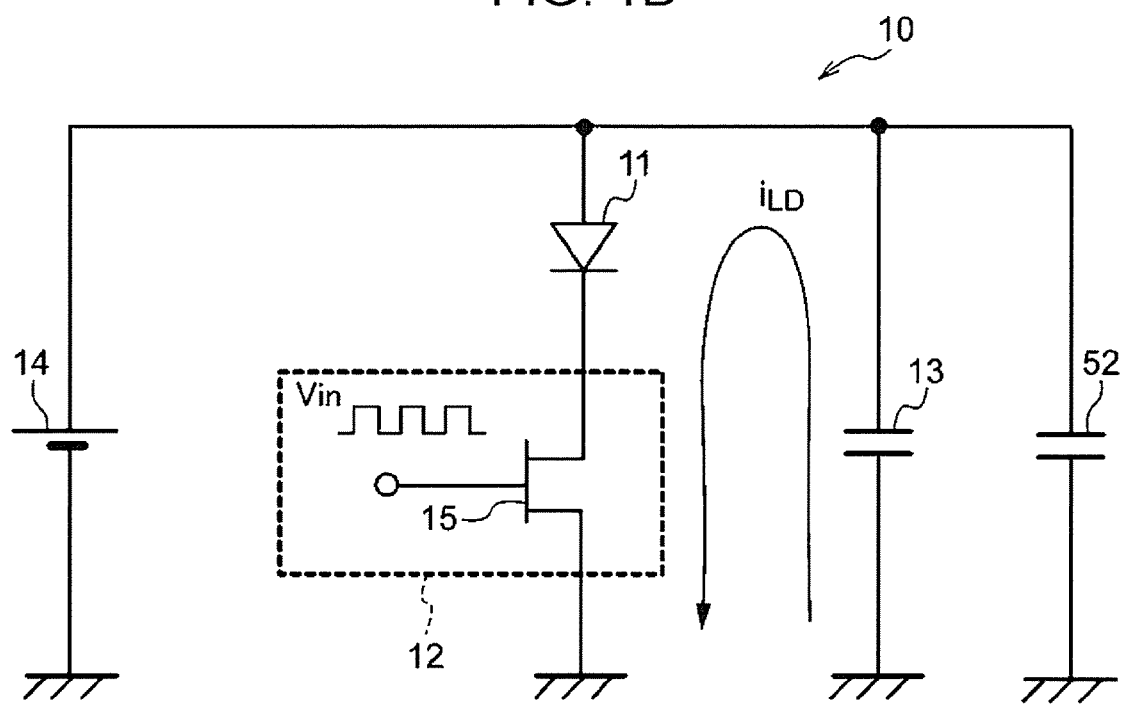
FIG. 1B is a circuit diagram of the light emitting device.
Figure 2:
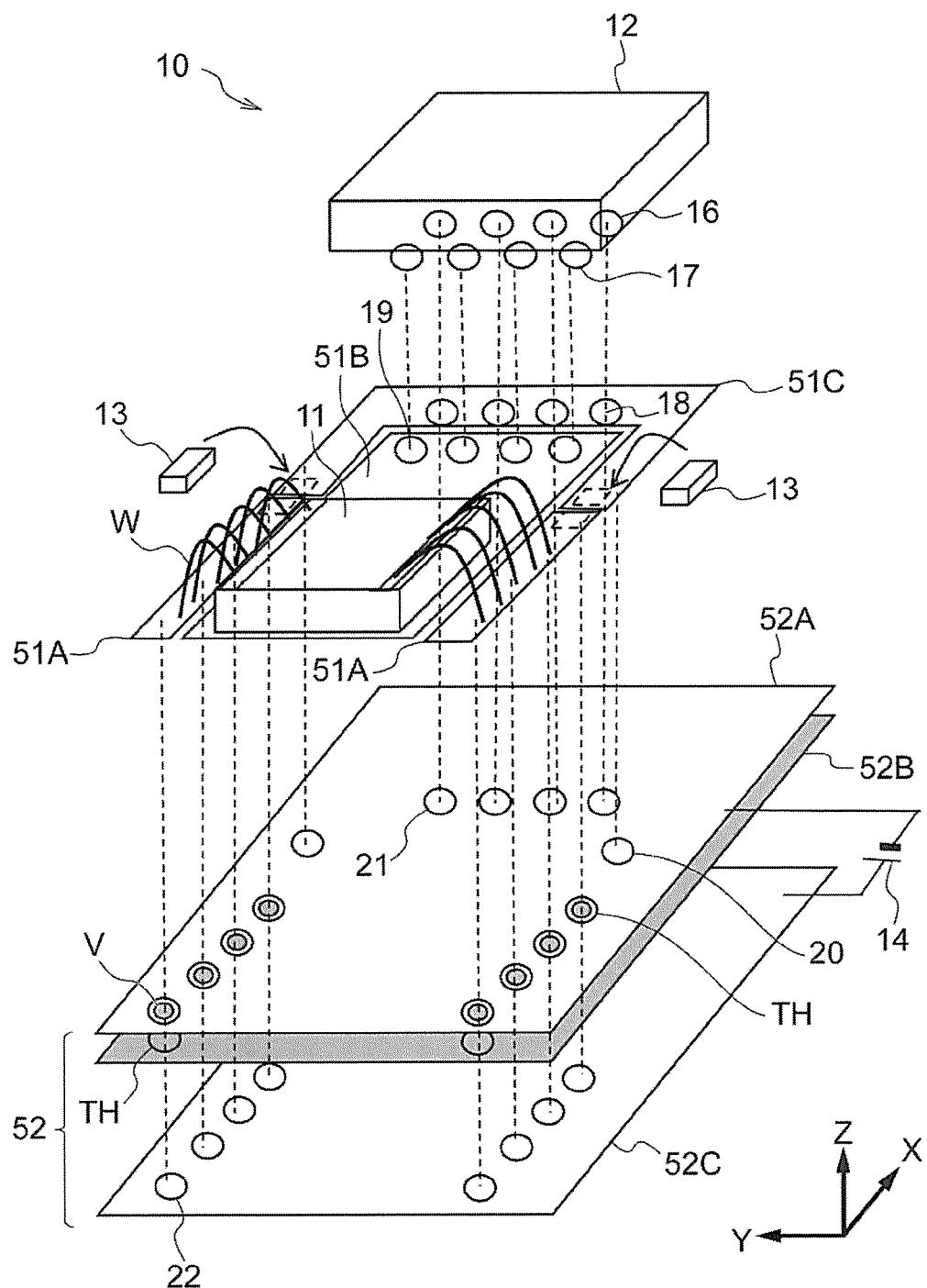
FIG. 2 is an exploded perspective view for explaining the configuration of a light emitting device according to a first exemplary embodiment.

A light emitting device 10 according to a first exemplary embodiment will now be described with reference to FIGS. 1A to 2. FIG. 1A is a cross-sectional view of the light emitting device 10 according to this exemplary embodiment, and FIG. 1B is a circuit diagram of the light emitting device 10. FIG. 2 is an exploded perspective view for explaining the configuration of the light emitting device 10 in more detail. The cross-sectional view shown in FIG. 1A is taken along an X axis from near the center in a Y-axis direction in the exploded perspective view shown in FIG. 2.

As shown in FIG. 1A, the light emitting device 10 includes a substrate 50, a light emitting element 11, and a driving element 12.

The substrate 50 according to this exemplary embodiment is constituted of, for example, a multilayer printed substrate (i.e., four layers in FIG. 1A) composed of glass epoxy resin.

The light emitting element 11 according to this exemplary embodiment is a section that generates light to be output from the light emitting device 10, and is constituted by using, for example, a vertical cavity surface emitting laser (VCSEL). The light emitting element 11 may be a VCSEL array, which includes two or more vertical cavity surface emitting lasers.

The driving element 12 drives the light emitting element 11 to cause the light emitting element 11 to emit light, and is formed of, for example, a semiconductor integrated circuit.

As shown in FIG. 1A, the substrate 50 includes a first wiring layer 51, a capacitor layer 52, a third wiring layer 53, and a fourth wiring layer 54 as four wiring layers. Specifically, the capacitor layer 52 is disposed at a position corresponding to a second wiring layer. A pre-impregnated layer 55 is disposed between the first wiring layer 51 and the capacitor layer 52, a core layer 56 is disposed between the capacitor layer 52 and the third wiring layer 53, and a pre-impregnated layer 57 is disposed between the third wiring layer 53 and the fourth wiring layer 54. In the following description, the surface of the substrate 50 having the first wiring layer 51 formed thereon may sometimes be referred to as "circuit surface", and each of the layers below the circuit surface (in the −Z direction) may sometimes be referred to as "inner layer".

As shown in FIG. 1A, in the capacitor layer 52, a dielectric layer 52B is interposed between a ground (GND) pattern 52A and an anode pattern 52C. The dielectric layer 52B constitutes a capacitive dielectric realized by the capacitor layer 52, and the GND pattern 52A and the anode pattern 52C constitute electrodes at opposite ends of the capacitor layer 52. The dielectric layer 52B includes, for example, strontium titanate (STO). The GND pattern 52A is connected to the ground of the light emitting device 10, and the anode pattern 52C is connected to the anode of the light emitting element 11. The capacitor layer 52 will be described in detail later. As an alternative to this exemplary embodiment in which the capacitor layer 52 is disposed over the entire surface of the substrate 50, the capacitor layer 52 may have an area smaller than that of the substrate 50. However, with the capacitor layer 52 being provided over the entire surface of the substrate 50, the impedance of a driving circuit may be reduced, thereby readily building up a larger driving current at high speed. If the capacitor layer 52 is not provided over the entire surface of the substrate 50, at least the capacitor layer 52 may have an area that covers a cathode pattern 51B. As another alternative, the capacitor layer 52 may be configured to have an area that covers at least the cathode pattern 51B and an anode pattern 51A. With such a configuration, the impedance of the driving circuit may be reduced, thereby readily building up a larger driving current at high speed.

As shown in FIG. 1A, the light emitting element 11 and the driving element 12 are both mounted on one of the surfaces of the substrate 50. As will be described later, the lower surface of the light emitting element 11 serves as a cathode electrode. In this exemplary embodiment, the cathode electrode is connected to the first wiring layer 51 by, for example, soldering. The driving element 12 includes, for example, solder balls 23 as connection terminals to be connected to the outside, and is connected to the first wiring layer 51 by the solder balls 23.

The third wiring layer 53 and the fourth wiring layer 54 are used for routing, for example, a control signal to the light emitting element 11 or the driving element 12. A cathode connection terminal 17 and a GND connection terminal 16 will be described later.

Next, an electrical configuration of the light emitting device 10 will be described with reference to FIG. 1B. In FIG. 1B, only a final-stage transistor 15 that supplies electric current to the light emitting element 11 is shown as the driving element 12. Although a metal-oxide-semiconductor (MOS) transistor is shown as the transistor 15 in FIG. 1B, a bipolar transistor may be used as an alternative. The gate of the transistor 15 receives a pulse signal Vin, and the light emitting element 11 is driven by, for example, pulsed current corresponding to the pulse signal Vin. As shown in FIG. 1B, the light emitting element 11 and the transistor 15 are connected in series, and a power source 14 is connected in parallel with the series circuit. The power source 14 supplies a driving current iLD to the light emitting element 11. The capacitor layer 52 is equivalently connected in parallel with the series circuit of the light emitting element 11 and the transistor 15. In the light emitting device 10, a general-purpose (normal) capacitor 13 is also connected to the series circuit of the light emitting element 11 and the transistor 15.

In recent years, the application of high-light-output VCSELs used in, for example, time-of-flight (TOF) measuring devices is expanding. Specifically, with regard to VCSELs in recent years, it is sometimes demanded that driving be performed with a large electric current. On the other hand, side reduction is desired in apparatuses equipped with measuring devices, as seen in portable terminals. As a result, it is desired that light emitting devices used in measuring devices are also greatly reduced in size by about several millimeters square. Moreover, in TOF measuring devices, high-speed driving of about several hundreds of MHz is desired in view of measurement accuracy. In other words, in VCSELs in recent years, it is desired that an electric current with an amplitude on the order of amperes is drivable in a build-up time of several hundreds of picoseconds.

As mentioned above, the light emitting device 10 according to this exemplary embodiment is configured as a light emitting device that includes a high-speed-drive, high-light-output VCSEL. Therefore, in the light emitting device 10, a decoupling capacitor with a high capacitance value is disposed at the power source, and the driving current is supplied from the decoupling capacitor. In order to increase the light output power from the VCSEL and to achieve high-speed driving in such a configuration, it is desirable to reduce the impedance in the path of the driving current as much as possible. A method of how the impedance is reduced in this exemplary embodiment will be described later.

The configuration of the light emitting device 10 according to this exemplary embodiment will be described in further detail with reference to FIG. 2. FIG. 2 illustrates a state where the first wiring layer 51 and the capacitor layer 52 (i.e., the second wiring layer) are taken out from the wiring layers of the substrate 50 shown in FIG. 1A.

As shown in FIG. 2, the first wiring layer 51 includes the anode pattern 51A, the cathode pattern 51B, and a GND pattern 51C. The "anode pattern 51A", the "cathode pattern 51B", and the "GND pattern 51C" are examples of a "first wiring pattern", a "second wiring pattern", and a "reference potential pattern", respectively, according to an exemplary embodiment of the present disclosure.

The anode pattern 51A is a wiring pattern connected to the anode of the light emitting element 11. Substantially the entire upper surface of the light emitting element 11 according to this exemplary embodiment, excluding a light aperture of the light emitting element 11, serves as an anode electrode. Therefore, the upper surface of the light emitting element 11 is connected to the anode pattern 51A by multiple bonding wires W. As shown in FIG. 2, the multiple bonding wires W are disposed in the extending direction of the anode pattern 51A. As an alternative to this exemplary embodiment in which the bonding wires W are connected to the upper surface of the light emitting element 11 in two directions, the bonding wires W may be connected to the upper surface of the light emitting element 11 in one direction or three directions, instead of two directions. The "bonding wires W" are an example of "connection members" according to an exemplary embodiment of the present disclosure.

The anode pattern 51A is connected to an anode base 22 of the anode pattern 52C through vias V. Therefore, through-holes TH are provided at positions corresponding to the vias V in the GND pattern 52A and the dielectric layer 52B. A "base" in this exemplary embodiment does not have a specific pattern but refers to a region with which the vias V come into contact.

As mentioned above, the cathode pattern 51B is connected to the lower surface of the light emitting element 11. Moreover, the cathode pattern 51B is connected to the cathode connection terminal 17 (solder balls) of the driving element 12 via a cathode base 19. As shown in FIG. 2, the anode pattern 51A extends along the cathode pattern 51B from the light emitting element 11 toward the driving element 12.

The GND pattern 51C is connected to the GND connection terminal 16 (solder balls) of the driving element 12 via a GND base 18. The GND base 18 is connected to a GND base 21 of the GND pattern 52A through a via V (not shown). The "GND connection terminal 16" is an example of a "reference potential terminal" according to an exemplary embodiment of the present disclosure. Because the GND connection terminal 16 is connected to the GND base 21 directly therebelow via the GND base 18, an impedance component of the circuit may be reduced, as compared with a configuration in which the GND connection terminal 16 is connected to the GND base 21 at a position not directly therebelow.

The light emitting device 10 according to this exemplary embodiment is further provided with a capacitor 13. As shown in FIG. 2, the capacitor 13 is provided between the anode pattern 51A and the GND pattern 51C such that at least a portion of the capacitor 13 is included in a widthwise range of the anode pattern 51A in the Y-axis direction. Furthermore, the capacitor 13 is provided such that at least a portion thereof overlaps an extension of a connection point between the bonding wires W and the anode pattern 51A. Moreover, an electrode (terminal) of the capacitor 13 is disposed along the X axis for achieving further size reduction of the light emitting device 10. In an equivalent circuit, the capacitor 13 is connected in parallel with a capacitor provided by the capacitor layer 52 (see FIG. 1B). Therefore, the lower section of the electrode at the GND pattern 51C side of the capacitor 13 is connected to a GND base 20 on the GND pattern 52A through a via V (not shown). The "capacitor 13" is an example of a "capacitive element" according to an exemplary embodiment.

As mentioned above, in the light emitting device 10 according to this exemplary embodiment, it is desirable to reduce the impedance of the path of the driving current iLD, that is, a loop constituted by VCSEL (anode), VCSEL (cathode), constant-current transistor (transistor 15), GND, decoupling capacitor (capacitor layer 52 and capacitor 13), and VCSEL (anode). Specifically, in order to build up a large driving current at high speed, it is desirable to prevent the build-up of the driving current from slowing down by reducing the inductance component and increasing the capacitance component as much as possible. In detail, it is desired that the impedance component of the loop be, for example, approximately 0.5 nH or lower.

In this exemplary embodiment, the substrate (printed substrate) is provided with a thin-film capacitor layer 52 as an inner layer. Accordingly, a light emitting device in which the impedance of the driving circuit is reduced may be provided, as compared with a configuration that supplies driving current to the light emitting element from only a chip-type capacitive element provided on the substrate.

Especially in a case where the substrate 50 is to be reduced in size, it is assumed that increasing the capacitance value of the capacitor layer 52 may be difficult. In the light emitting device 10, the capacitor 13 is further provided as a capacitor that supplies electric current. The capacitor 13 is an example of a general-purpose capacitor with a relatively large capacitance. If the capacitor layer 52 has enough capacitance for electrically driving the light emitting element 11, the capacitor 13 does not necessarily have to be provided.

In contrast, if the capacitor layer 52 provided has a relatively small capacitance value and the capacitor 13 provided has a relatively large capacitance value, the capacitor layer 52 may be used for supplying a driving current iLD with a relatively-high frequency component included in the build-up of the pulse signal Vin, and the capacitor 13 may be used for supplying a driving current iLD with a relatively-low frequency component not included in the build-up of the pulse signal Vin.

Furthermore, in this exemplary embodiment, the electric current flowing through the transistor 15 flows along two paths, namely, a path extending from the GND connection terminal 16 to the GND base 21 through the vias V and a path extending from the GND connection terminal 16 toward the capacitor 13 via the GND pattern 51C. Thus, the circuit impedance may be reduced, as compared with a configuration not having the GND pattern 51C, as in a second exemplary embodiment to be described below.

Second Exemplary Embodiment

A light emitting device 10A according to a second exemplary embodiment will now be described with reference to FIG. 3. The light emitting device 10A is configured such that the GND pattern 51C in the light emitting device 10 according to the first exemplary embodiment is replaced with a GND pattern 51D. Therefore, components identical to those of the light emitting device 10 will be given the same reference signs, and detailed descriptions thereof will be omitted.

Figure 3:
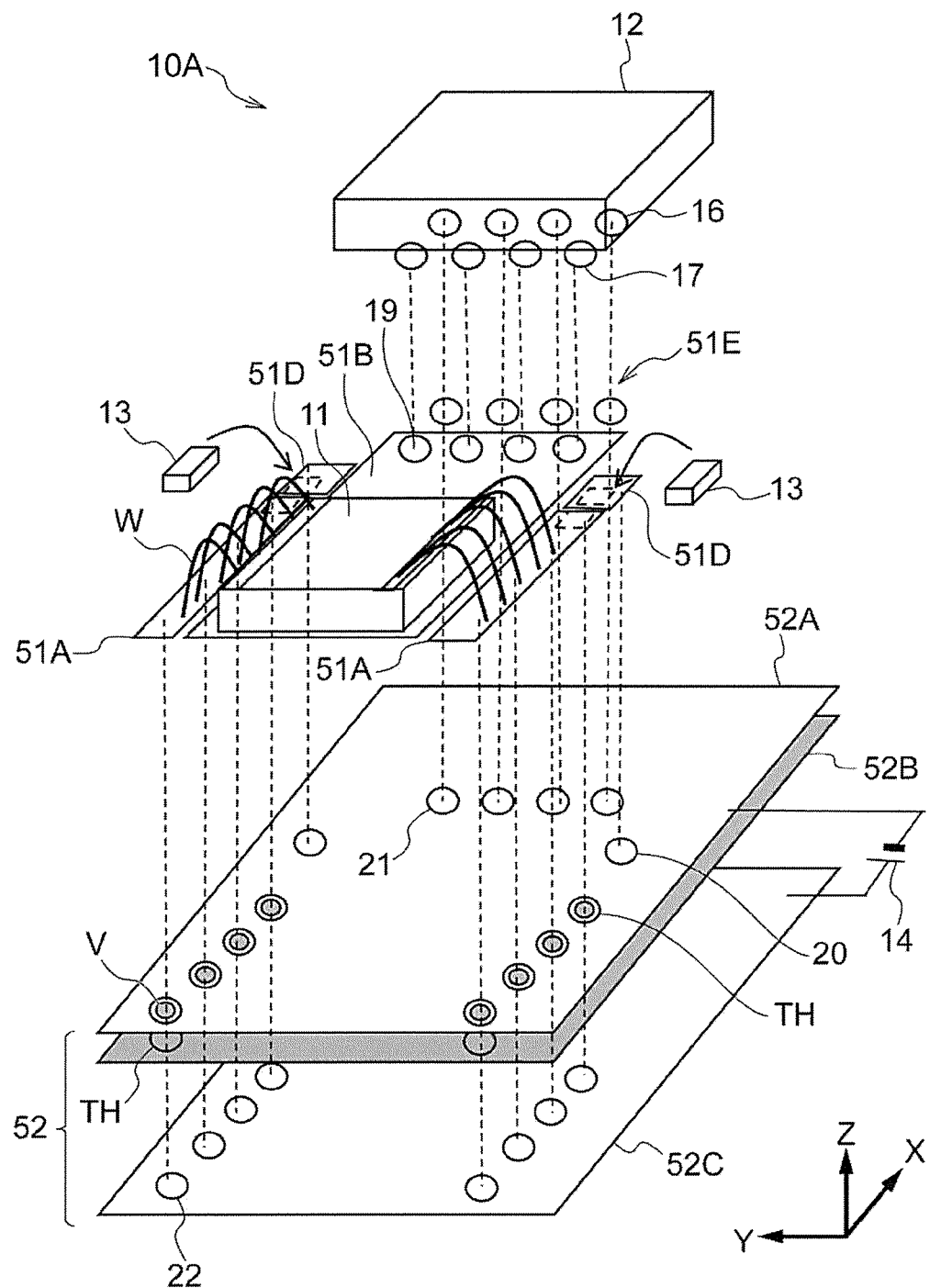
FIG. 3 is an exploded perspective view for explaining the configuration of a light emitting device according to a second exemplary embodiment.

As shown in FIG. 3, the GND pattern 51D and a GND pattern 51E have been reduced to a size for mounting thereon the electrode of the capacitor 13 and the GND connection terminal 16, as compared with the GND pattern 51C. The GND pattern 51D includes two GND patterns in correspondence with two capacitors 13, and the GND pattern 51E includes four GND patterns in correspondence with four GND connection terminals 16. The GND patterns 51D are connected to the GND base 20 of the GND pattern 52A through vias V (not shown), and the GND patterns 51E are connected to the GND base 21 of the GND pattern 52A through vias V (not shown).

Specifically, in this exemplary embodiment, the region other than the region facing the GND base 20 and the GND base 21 in the GND pattern 51C in the first exemplary embodiment has been omitted.

In the first exemplary embodiment, a large portion of the electric current flowing through the transistor 15 flows to the GND base 21 from the GND connection terminal 16 through the vias V located directly therebelow, whereas a small portion of the electric current flows through the GND pattern 51C from the GND connection terminal 16 toward the capacitor 13. With regard to the former path, the electric current flows into the GND pattern 52A having a large area. With regard to the latter path, the electric current flows via the GND pattern 51C having a small width, so that the impedance becomes high accordingly. Accordingly, in the first exemplary embodiment, the circuit impedance is reduced since the GND pattern 51C is provided, but the reducing effect is not large. Therefore, in a case where it is desirable to further reduce the circuit impedance, the configuration provided with the GND pattern 51C as in the first exemplary embodiment is desirable. However, if it is desirable to both reduce the circuit impedance and ensure space surrounding the driving element, the configuration according to this exemplary embodiment that does not have the GND pattern 51C is desirable. This is because, without the GND pattern 51C, other components may be mounted in that area.

As an alternative to each of the above exemplary embodiments in which the capacitor layer 52 has the GND pattern 52A at the circuit surface side and the anode pattern 52C at the inner layer side, this arrangement may be inverted, that is, the anode pattern 52C may be provided at the circuit surface side and the GND pattern 52A may be provided at the inner layer side. However, with the GND pattern 52A located at the circuit surface side and the anode pattern 52C located at the inner layer side, as in the above exemplary embodiments, a capacitive component is provided not only in the capacitor layer 52 but also between the anode pattern 51A and the GND pattern 52A, so that the impedance of the driving circuit may be reduced, thereby readily building up a larger driving current at high speed, as compared with the configuration in which the anode pattern 52C is located at the circuit surface side and the GND pattern 52A is located at the inner layer side.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light emitting device comprising:
    a substrate, comprising a first surface and a second surface opposite to the first surface;
    a light emitting element and a driving element that are provided on the first surface of the substrate, the driving element driving the light emitting element;
    a capacitor layer that is provided in the substrate and that supplies electric current to the light emitting element via the driving element, and
    a capacitive element that is provided on the first surface of the substrate and that supplies electric current to the light emitting element via the driving element,
    wherein the capacitor layer is used for supplying a driving current in a build-up of a pulse signal, and the capacitive element is not used for supplying the driving current in the build-up of the pulse signal.

2. The light emitting device according to claim 1, further comprising:
    a reference potential pattern that is provided on the substrate and that is connected to a reference potential terminal of the driving element; and
    a first wiring pattern that is provided on the substrate and that is connected to an upper electrode of the light emitting element,
    wherein the capacitive element is connected to the reference potential pattern and the first wiring pattern.

3. The light emitting device according to claim 2, further comprising:
    a second wiring pattern that is provided on the substrate and that connects the light emitting element and the driving element,
    wherein the first wiring pattern extends along the second wiring pattern from the light emitting element toward the driving element, and
    wherein the capacitive element has terminals at opposite ends of the capacitive element, the terminals being arranged in a direction in which the first wiring pattern extends.

4. The light emitting device according to claim 2,
    wherein at least a portion of the capacitive element is included in a widthwise range of the first wiring pattern.

5. The light emitting device according to claim 3,
    wherein at least a portion of the capacitive element is included in a widthwise range of the first wiring pattern.

6. The light emitting device according to claim 2, further comprising:
    a plurality of wiring members that connect the upper electrode of the light emitting element and the first wiring pattern,
    wherein the plurality of wiring members are disposed in a direction in which the first wiring pattern extends, and
    wherein at least a portion of the capacitive element overlaps an extension of a connection point between the plurality of wiring members and the first wiring pattern.

7. The light emitting device according to claim 3, further comprising:
    a plurality of wiring members that connect the upper electrode of the light emitting element and the first wiring pattern,
    wherein the plurality of wiring members are disposed in the direction in which the first wiring pattern extends, and
    wherein at least a portion of the capacitive element overlaps an extension of a connection point between the plurality of wiring members and the first wiring pattern.

8. The light emitting device according to claim 4, further comprising:
    a plurality of wiring members that connect the upper electrode of the light emitting element and the first wiring pattern,
    wherein the plurality of wiring members are disposed in a direction in which the first wiring pattern extends, and
    wherein at least a portion of the capacitive element overlaps an extension of a connection point between the plurality of wiring members and the first wiring pattern.

9. The light emitting device according to claim 5, further comprising:
    a plurality of wiring members that connect the upper electrode of the light emitting element and the first wiring pattern,
    wherein the plurality of wiring members are disposed in the direction in which the first wiring pattern extends, and
    wherein at least a portion of the capacitive element overlaps an extension of a connection point between the plurality of wiring members and the first wiring pattern.

10. The light emitting device according to claim 1,
    wherein the light emitting element is a vertical cavity surface emitting laser.

11. A light emitting device comprising:
    a substrate, comprising a first surface and a second surface opposite to the first surface;
    light emitting means for emitting light and driving means for driving the light emitting means, the light emitting means and the driving means being provided on the first surface of the substrate;

capacitor means for supplying electric current to the light emitting means via the driving means, the capacitor means being provided in the substrate, and a capacitive means that is provided on the first surface of the substrate and that supplies electric current to the light emitting element via the driving element, wherein the capacitor means is used for supplying a driving current in a build-up of a pulse signal, and the capacitive means is not used for supplying the driving current in the build-up of the pulse signal.

* * * * *